United States Patent
Powell et al.

(10) Patent No.: US 7,274,581 B1
(45) Date of Patent: Sep. 25, 2007

(54) ARRAY FAULT TESTING APPROACH FOR TCAMS

(75) Inventors: Theo Jay Powell, Dallas, TX (US); Bryan D Sheffield, McKlnney, TX (US); Rashmi Sachan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/381,540

(22) Filed: May 4, 2006

(51) Int. Cl.
*G11C 15/00* (2006.01)

(52) U.S. Cl. .......................................... 365/49; 365/200

(58) Field of Classification Search .................. 365/49
See application file for complete search history.

(56) References Cited

U.S. PATENT DOCUMENTS 6,584,003 B1 * 6/2003 Kim et al. ..................... 365/49
6,965,519 B1 * 11/2005 Park et al. ..................... 365/49
7,133,302 B1 * 11/2006 Srinivasan et al. ........... 365/49
2005/0050408 A1 * 3/2005 Kaginele ..................... 714/718

* cited by examiner

*Primary Examiner*—Son L. Mai
(74) *Attorney, Agent, or Firm*—Alan K. Stewart; W. James Brady; Frederick J. Telecky, Jr.

(57) ABSTRACT

A novel array fault testing for a TCAM system that includes a plurality of TCAM blocks that is organized into at least one rectangular array having rows each having a plurality of TCAM blocks, a group of TCAM cells and associated read/write bit lines connecting the group of TCAM cells to write driver and decoding block. The data decode bypass circuit of the TCAM cell provides a raw write feature to detect faults in a full suite of memory related tests. The debug input of the data debug bypass circuit of the TCAM cell when asserted in the test mode enables the TCAM cell to write raw, unencoded data into the array, and when deasserted in the test mode, enables the testing of the TCAM array. The resulting TCAM cell provides exhaustive fault testing thereby detecting and eliminating faults in TCAM.

17 Claims, 6 Drawing Sheets

| DATAIN | DCMIN | W0 | WB0 | W1 | WB1 | WBIT0 | WBITB0 | WBIT1 | WBITB1 |
|---|---|---|---|---|---|---|---|---|---|
| 0 | 0 | 1 | 0 | 0 | 1 | 0 | 1 | 1 | 0 |
| 1 | 0 | 0 | 1 | 1 | 0 | 1 | 0 | 0 | 1 |
| 0 | 1 | 1 | 0 | 1 | 0 | 0 | 1 | 0 | 1 |
| 1 | 1 | 1 | 0 | 1 | 0 | 0 | 1 | 0 | 1 |

| DATAIN | DCMIN | W0 | WB0 | W1 | WB1 | WBIT0 | WBITB0 | WBIT1 | WBITB1 |
|---|---|---|---|---|---|---|---|---|---|
| 0 | 0 | 1 | 0 | 1 | 0 | 0 | 1 | 0 | 1 |
| 1 | 0 | 0 | 1 | 1 | 0 | 1 | 0 | 0 | 1 |
| 0 | 1 | 1 | 0 | 0 | 1 | 0 | 1 | 1 | 0 |
| 1 | 1 | 0 | 1 | 0 | 1 | 1 | 0 | 1 | 0 |

ARRAY FAULT TESTING APPROACH FOR TCAMS

TECHNICAL FIELD OF THE INVENTION

The present invention relates generally to digital integrated circuits, and more particularly relates to testing of content addressable memories (CAMs).

BACKGROUND OF THE INVENTION

Content Addressable Memories (CAMs) are commonly used in cache systems, and other address translation systems, of high speed computing systems. They are also useful in high-speed network routers, and many other applications known in the art of computing. Ternary Content Addressable Memories (TCAMs) are ternary state CAM cells and are commonly used for parallel search of high performance computing systems.

A TCAM system is composed of TCAM blocks with arrays of TCAM cells. A TCAM system typically has a TCAM block array (M×N) that includes a plurality of rows (M) and a plurality of columns (N). Further, each row has a plurality of TCAM blocks, and each TCAM block has a plurality of TCAM cells. These arrays typically have vertically running bit lines and search lines for data read/write function and horizontal running word lines and match lines. All TCAM cells in a column share the same bit lines and search lines, whereas the word lines and match lines are shared by all cells in a row. Each TCAM cell includes a pair of memory elements and a corresponding pair of compare circuits.

The TCAM cells are characterized by circuitry capable of generating a match output for each row of TCAM blocks in the TCAM cell thereby indicating whether any location of the array contains a data pattern that matches a query input and the identity of that location. Each TCAM cell typically has the ability to store a unit of data, and the ability to compare that unit of data with a unit of query input and each TCAM block has the ability to generate a match output. In parallel data search, an input keyword is placed at the search bit lines after precharging the match lines to a power supply voltage Vdd. The data in each TCAM cell connected to a match line is compared with this data, and if there is a mismatch in any cell connected to a match line, the match line will discharge to ground through the compare circuit of that TCAM cell. A compare result indication of each TCAM block in a row is combined to produce a match signal for the row to indicate whether the row of TCAM cells contains a stored word matching a query input. The match signals from each row in the TCAM cell together constitute match output signals of the array; these signals may be encoded to generate the address of matched locations or used to select data from rows of additional memory.

Each TCAM cell in each column is typically connected to a common read/write bit line pair and search bit line pair. The common read/write bit line is used to write the data to a pair of memory cells, which can be part of a TCAM cell. Each memory cell is accessed using a word line which is decoded using an input address. The common read/write bit line is also used for reading the data from a memory cell. The differential developed across the read/write bit lines are sensed using a sense amplifier during a read cycle.

Further, each TCAM cell in each column is typically connected to a common query data line, also referred to as a common search bit line. The common search bit line enables simultaneous data searching in each CAM cell in a column from a query input. The common search data line can also be used as a write data line, when the CAM cell is based on a PMOS compare circuit.

Each CAM cell in each column of a CAM array is typically connected to a common read/write bit line and a search bit line. The common read/write bit line is used to write the data to a pair of memory cells, which can be part of a ternary CAM (TCAM) cell or a single memory cell, such as a binary CAM. Each memory cell is accessed using a word line which is decoded using an input address. The common read/write bit line is also used for reading the data from a memory cell. The differential developed across the read/write bit lines are sensed using a sense amplifier during a read cycle.

Further, each CAM cell in each column in the CAM arrays is typically connected to a common query data line, also referred to as a common search data line. The common search data line enables simultaneous data searching in each CAM cell in a column from a query input. The common search data line can also be used as a write data line, when the CAM array is based on a PMOS compare circuit.

The unit of data that is stored in a TCAM cell is ternary, having three possible states: logic one, logic zero, and don't care. To store these three states, two memory elements are needed. TCAM blocks of these TCAM cells produce a local match compare result if the query input is equal to the data stored in the CAM cells in the TCAM blocks, the query input contains a don't care state, or the data stored is a don't care data. The TCAM cells produce a mismatch result otherwise. The TCAM cells are particularly useful in address translation systems that allow variable sized allocation units.

Typically, in a TCAM array, the common read/write bit lines are precharged after each write or read cycle using precharge devices. Typically, the input data during search or write mode is written in encoded form into TCAM cells. The input data at a CAM location comes in the form of a pair of input signals DATAIN (data) and DCMIN (data mask). If DCM is high, the encoded form of "don't care" during a write cycle is written into the TCAM cell. If DCM is low, the actual value of D (data) which is a "zero" or "one" gets written in an encoded form into the TCAM cell. The encoding in the TCAM cell could be (0,1) corresponding to a "zero", or a (1,0) corresponding to a "one", or a (0,0) corresponding to a "don't care". The encoded writing makes it difficult to exhaustively test the bit cells for faults in the TCAM array as is typically. The bit faults in TCAMS cannot be tested using the march pattern test typically performed in the normal SRAM cells.

SUMMARY OF THE INVENTION

According to an aspect of the subject matter, there is provided a technique for fault testing a TCAM block array. The TCAM cell includes a pair of memory elements which is connected to an associated pair of compare circuits. Further, a decoding bypass circuitry in the TCAM cell provides a raw write feature to detect faults in a full suite of memory related tests. The DEBUGSEL input of the bypass circuitry of the TCAM cell when asserted in the test mode enables the TCAM cell to write raw, nondecoded data into the array, and when deasserted in the test mode, enables the testing of the TCAM array. The resulting TCAM cell provides exhaustive fault test coverage for detecting and eliminating faults in TCAMS.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
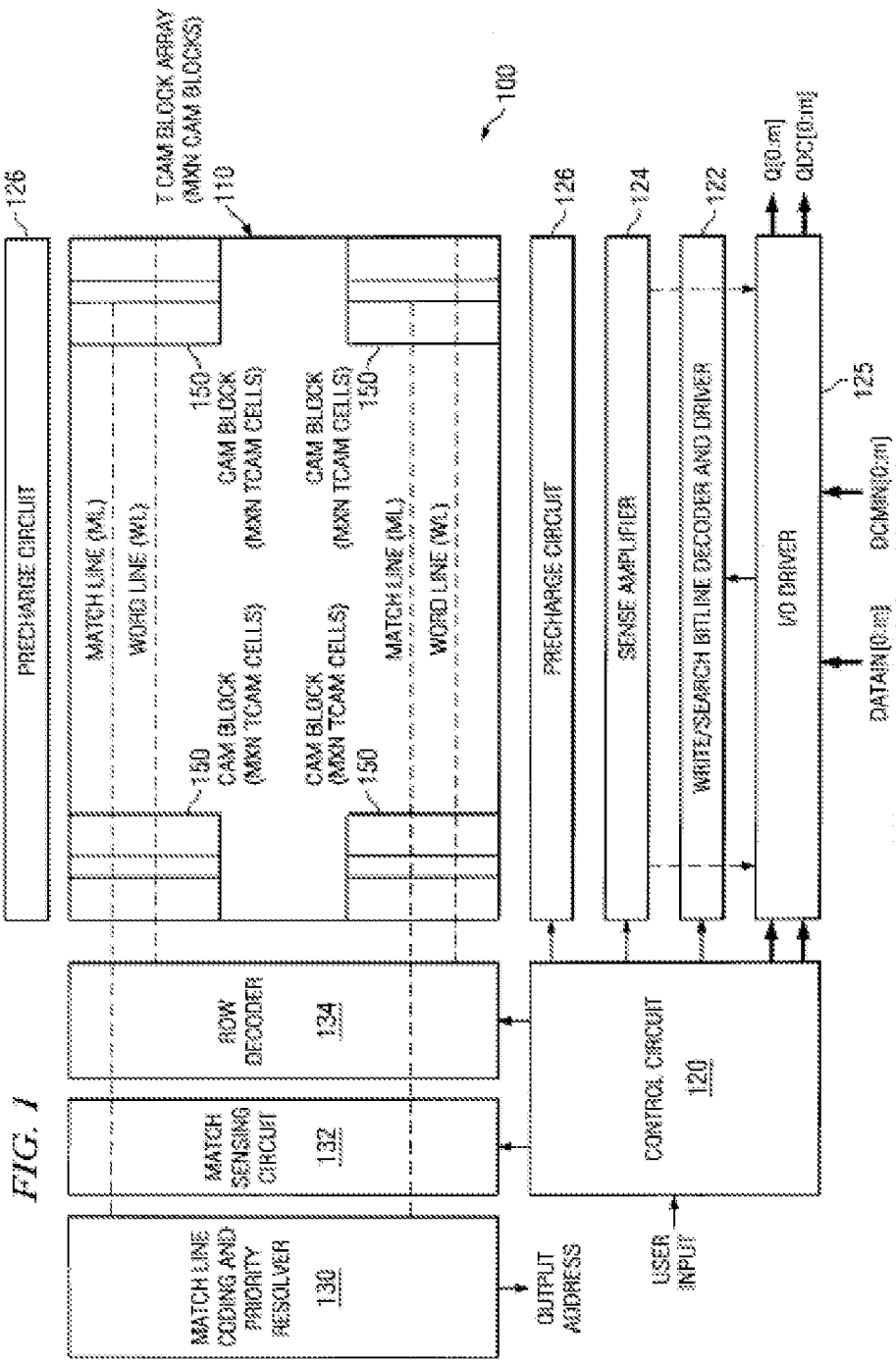
FIG. 1 is a block diagram of a TCAM system architecture according to an embodiment of the present invention.

Referring now to FIG. 1, there is illustrated an embodiment of a TCAM system 100 according to the present invention. The TCAM system 100 includes a TCAM block array 110, a control circuit 120, write/search bit line decoder and driver circuit 122, sense amplifier 124, read/write bitline and search bitline precharge circuit 126 and input/output (I/O) drivers 125. As shown in FIG. 1, the TCAM system 100 further includes a match line encoding and priority resolver 130, a match sensing circuit 132, and a row decoder 134.

Further as shown in FIG. 1, the TCAM block array 110 has multiple TCAM blocks 150 which are organized into at least one rectangular array which has a plurality of rows, and each row has a plurality of TCAM blocks, and each TCAM block 150 has a plurality of TCAM cells. In some embodiments, the TCAM block array 110 is arranged to include (M×N) TCAM blocks which has M number of rows and N number of columns. As shown in FIG. 1, each of the plurality of TCAM cells has an associated match line (ML) and a word line (WL). A control circuit 120 receives user input and is in communication with the precharge circuit 126, sense amplifier 124, write/search bit line decoder and driver 122, and I/O driver 125. An I/O driver 125 is in communication with the control circuit 120 and the write bit line decoder and driver 122. The I/O driver 125 receives the external input signals DATAIN [0:m] and DCMIN [0:m] in search and write operations and sends output signals Q [0:m] and QDC [0:m] in read operation where m is the number of data bits. The associated read/write bit lines and read/write bit complement lines BIT and BITB (shown in FIG. 2) are coupled to the one or more precharge circuits 126, the sense amplifier 124, and the write/search bit line decoder and driver circuit 122 (shown in FIG. 1). Further, the I/O driver 125 receives the external input signals DATAIN and DCMIN and output signals Q, and QDC (shown in FIG. 1). The DATAIN is a user sent input data sent to compare stored data. The DCMIN is a user data compare input. For example, if DCM is high then the input value is considered as a don't care input and value at DATAIN is not compared. In the case of a write operation, if DCM is high, then a don't care value is written into the memory cell pair. The Q and QDC outputs are the read output signals from the I/O driver 125.

Figure 2:
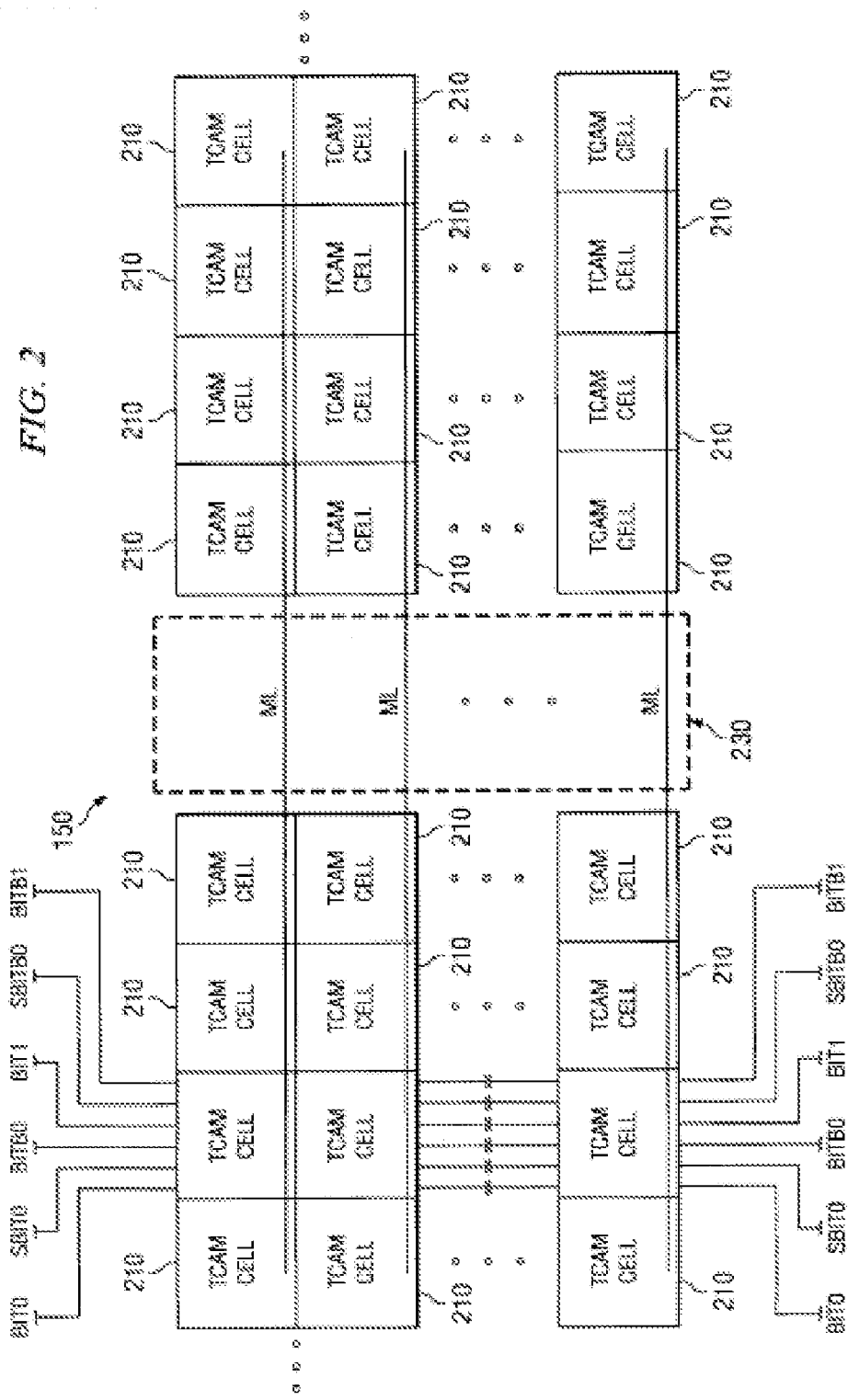
FIG. 2 is a block diagram of a TCAM block and its associated conversion circuitry according to an embodiment of the present invention, as shown in FIG. 1.

Referring now to FIG. 2, there is illustrated an embodiment of a TCAM block 150 (as shown in FIG. 1). As shown in FIG. 2, each TCAM block 150 includes a plurality of TCAM cells which are arranged into a rectangular array such that each TCAM cell 210 is associated with a row and a column in the CAM block 150. In some embodiments, each TCAM block 150 includes (M×N) TCAM cells arranged in a rectangular array of M number of rows and N number of columns. Each TCAM cell in the TCAM block 150 includes a pair of read/write bit lines BIT0, BIT1, and its associated pair of read/write bit complement lines BITB0, BITB1, and, a search bit line SBIT0 and its associated search bit complement line SBITB0, each of which is connected to each of the associated plurality of TCAM cells 210. FIG. 2 illustrates an example TCAM cell showing bit lines running vertically through each single TCAM cell.

Further as shown in FIG. 2, the plurality of TCAM cells 210 in each TCAM block 150 are connected to an associated match line ML. In some embodiments, each of the multiple TCAM blocks 150 includes a local to global conversion circuit 230, which converts the local match signal to a global match signal associated with each row of TCAM cells. In these embodiments, the global match signals are sensed using a match sensing circuit 132 (shown in FIG. 1). In these embodiments, each of the plurality of TCAM cells 210 includes a pair of memory elements for storing a data bit and a pair of associated compare circuits for comparing the stored data bit with a received compare data bit.

Figure 3:
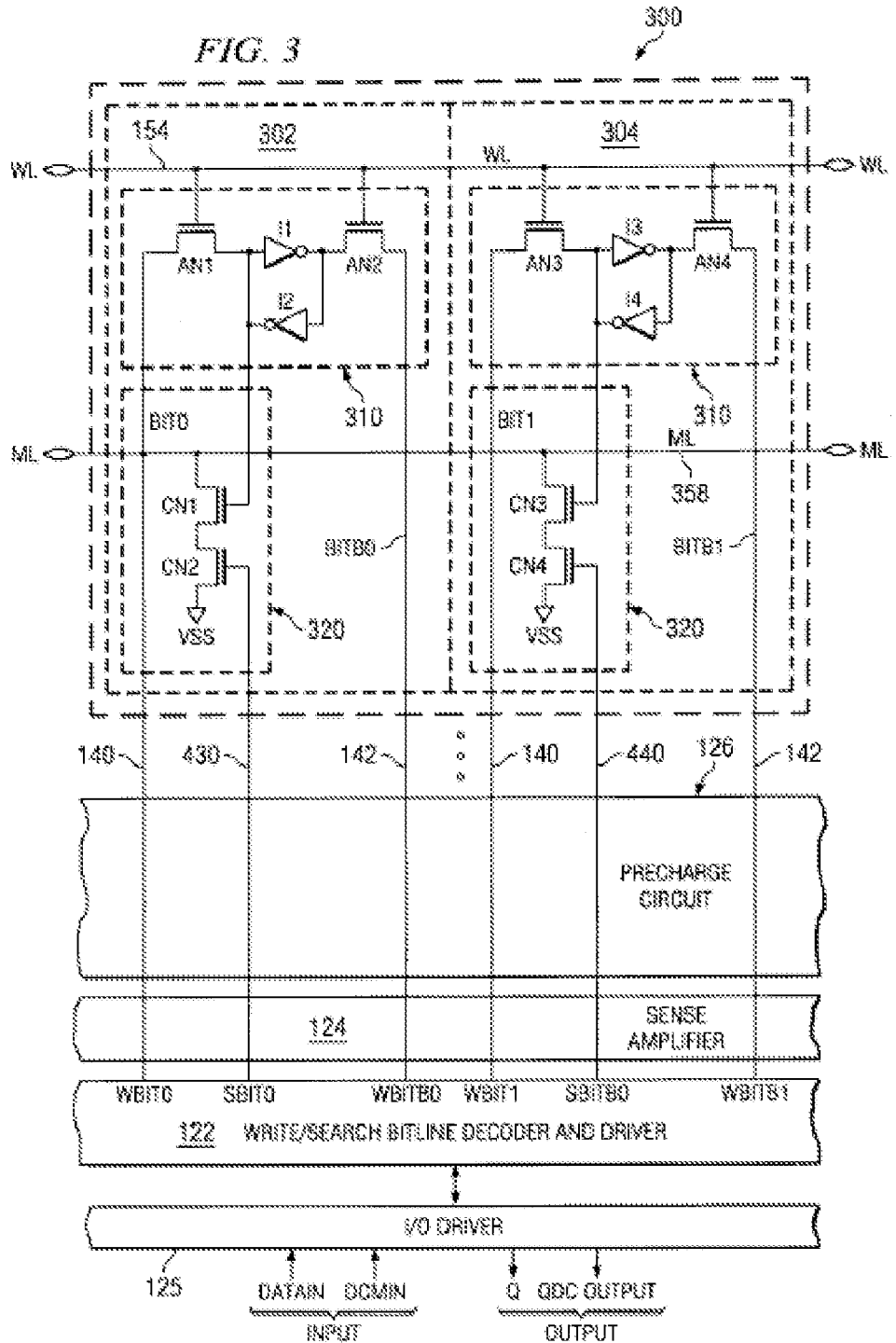
FIG. 3 is a schematic diagram showing the left and right circuit portions of a TCAM cell as shown in FIGS. 1 and 2.

Referring now to FIG. 3, there is illustrated a circuit diagram of a TCAM cell 300 of the present invention. As shown in FIG. 3, the TCAM cell 300 includes a left circuit portion 302, and a right circuit portion 304 interconnected to each other. Each of the left and right circuit portions includes a pair of memory elements 310 and their associated NMOS based pair of compare circuits 320. The memory element 310 in the left circuit portion includes a pair of back to back inverters I1 and I2, and a pair of access transistors AN1 and AN2. The left compare circuit 320 includes a pair of associated NMOS transistors CN1 and CN2. Similarly, the right circuit portion 304 includes inverters a pair of back to back inverters I3, and I4, and their associated access transistors AN3 and AN4. The right compare circuit 320 includes a pair of associated NMOS compare transistors CN3 and CN4. Match line ML runs horizontally through both the left and right circuit portions 302 and 304 respectively of the TCAM cell 300. The left circuit portion 302 includes a pair of read/write bit line and an associated read/write bit complement line BIT0, BITB0 respectively, and a search bit line SBIT0. The right circuit portion 304 includes a pair of read/write bit line and an associated read/write bit complement line BIT1, BITB1 respectively and a search bit complement line SBITB0. The search bit line SBIT0 and the search bit complement line SBITB0 is connected between the associated NMOS based compare circuits 420 and the write/search bit line decoder and driver circuit 122. The NMOS based compare circuit 320 as shown in FIG. 3, requires using separate search bit lines to search the data bits stored in the memory elements during a search cycle. In case of a mismatch, the match line ML will be pulled low.

The back to back inverters in each of the circuit portions is accessed via the gates of the associated pairs of NMOS access transistors and the read/write bit and read/write bit complement lines. Also, it can be seen that the NMOS based access transistors AN1 through AN4 are coupled to the read/write bit and read/write bit complement line. It can be seen that the associated read/write bit and read/write bit complement lines 140 and 142, respectively, are coupled to the one or more precharge circuits 126, the sense amplifier 124, and the write/search bit line decoder and driver circuit 122. Further as shown in FIG. 3, the I/O driver 125 receives the external input signals DATAIN and DCMIN and the output signals Q and QDC OUTPUT from the control circuit 120 (as shown in FIG. 1). The DATAIN is a user sent input data sent to compare stored data. The DCMIN is a user data compare input (used only in TCAMs). For example, if DCM is high, then the input value is considered as a don't care input and value at DATAIN is not compared. The Q is a data output signal and the QDC is a data compare output signal.

Figure 4:
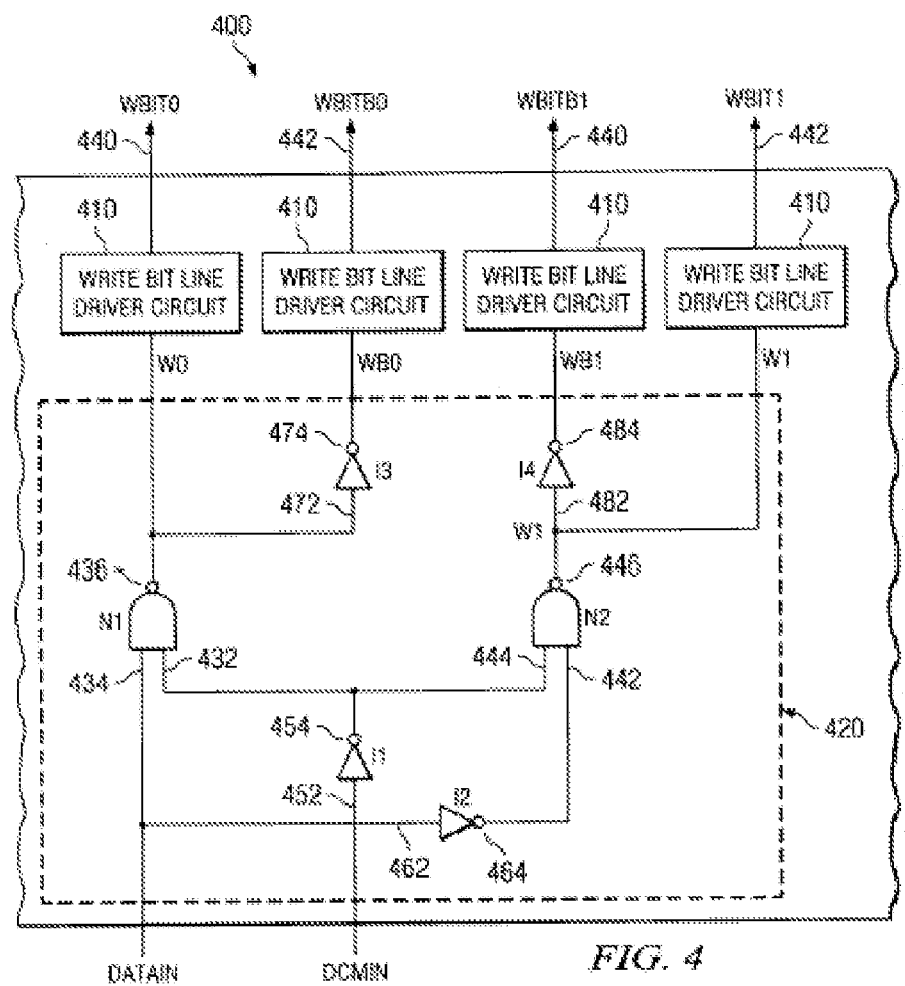
FIG. 4 is a schematic diagram of a write driver and data decode circuit without decoding bypass in a conventional TCAM cell.

Referring now to FIG. 4, there is illustrated an example write driver and decoder circuit 400 for the NMOS compare circuit based TCAM cell. As shown in FIG. 4, the write driver and decoder circuit 400 includes a write bit line driver circuit 410 associated with each read/write bit line 140 and the read/write complement bit line 142 and a data decode circuit 420 to decode input signals coming from the I/O driver 125 (shown in FIG. 1).

In some embodiments, as shown in FIG. 4, the data decode circuit 420 includes a first NAND gate N1, a second NAND gate N2, a first inverter I1, a second inverter I2, a third inverter I3, and a fourth inverter I4. The first NAND gate includes a first input 432, a second input 434 and an output 436. The second NAND gate includes a first input 442, a second input 444, and an output 446. The inputs 432 and 444 are connected to each other and to the output 454 of the inverter I1. Further, the first inverter I1 includes an input 452 and an output 454, the second inverter I2 includes an input 462 and an output 464, the third inverter I3 includes an input 472 and an output 474, and the fourth inverter I4 includes an input 482 and an output 484.

As shown in FIG. 4, the second input 434 of the first NAND gate N1 is coupled to receive external data input (DATAIN) from the I/O driver 125 (shown in FIGS. 1, and 3). The output 436 (W0) of the first NAND gate N1 is coupled to the associated write/search bit line driver and block 410. The input 452 of the first inverter I1 is coupled to receive external data complement input (DCMIN) from the I/O driver 125 (shown in FIGS. 1, and 3). The output 454 of the first inverter I1 is coupled to the first input 432 of the first NAND gate N1.

Further as shown in FIG. 4, the input 462 of the second inverter I2 is coupled to receive the DATAIN from the I/O driver 125 (shown in FIGS. 1 and 4). The first input 442 of the second NAND gate N2 is coupled to the output 464 of the second inverter I2. The second input 444 of the second NAND gate N2 is coupled to the output 454 of the first inverter I1 as well as the first input 432 of the first NAND gate N1. The output 446 (W1) of the second NAND gate N2 is coupled to the associated write bit line driver circuit 410.

Furthermore as shown in FIG. 4, the input 472 of the third inverter I3 is coupled to the output 436 of the first NAND gate N1. The output (WB0) 474 of the third inverter I3 is coupled to the associated write bit line driver circuit 410.

The input 482 of the fourth inverter 480 is coupled to the output 446 (W1) of the second NAND gate N2. The output 484 (WB1) of the fourth inverter I4 is coupled to the associated write bit line driver circuit 410.

In operation, the data decode circuit 420 described above receives the external input signals DATAIN and DCMIN. For example, if DATAIN=0, DCMIN=0, then W0(sig436)=1, WB0(sig474)=0, W1(sig482)=0, WB1(sig484)=1. The signal WB0 is the complement of W0, and the signal WB1 is the complement of W1.

The following table illustrates the output decoding achieved by the data decode circuit 420.

DATAIN=0 DCMIN=0, W0=1, W1=0, WBIT0=0, WBITB0=1, WBIT1=1, WBITB1=0 DATAIN=1 DCMIN=0, W0=0, W1=1, WBIT0=1, WBITB0=0, WBIT1=0, WBITB1=1 DATAIN=X DCMIN=1, W0=1, W1=1, WBIT0=0, WBITB0=1, WBIT1=0, WBITB1=1 wherein the signals W0, W1, WB0, and WB1 in the above table are outputs from the data decode circuit 420, which are used as inputs to the write/search bit line driver 122 (shown in FIG. 1).

Figures 5, 7A, 7B:
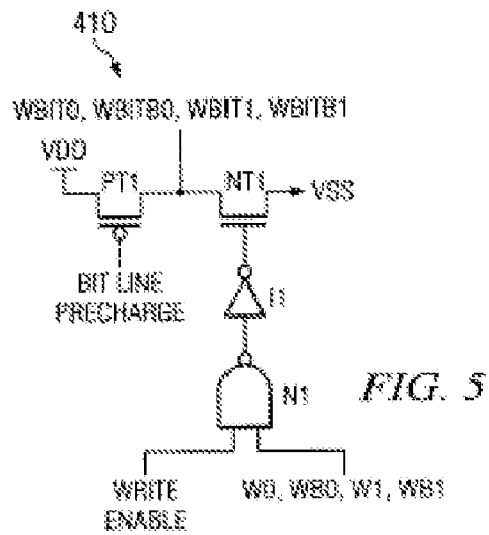
FIG. 5 is a schematic diagram of a write bit line driver circuit as shown in FIG. 4.
FIGS. 7a is a truth table of the data decode bypass circuit in normal mode and FIG. 7b is a truth table of the data decode bypass circuit in debug mode according to an embodiment of the present invention as shown in FIGS. 1, 2, 3, and 6.

Referring now to FIG. 5, there is illustrated a write bit line driver circuit 410. As shown in FIG. 5, the write bit line driver circuit 410 includes a 2 input NAND gate N1, having a first input coupled to a write enable signal WEN. The second input of the NAND gate can be any one of the signals W0, WB0, W1 and WB1. The output of the NAND gate is connected to an inverter I1, the output of I1 is coupled to a NMOS transistor NT1. The source of NT1 is connected to the drain of a PMOS transistor PT1 and the drain of NT1 is connected to ground terminal VSS. The source of PT1 is connected to power supply VDD and the gate of PT1 is connected to the bit line precharge signal. The output of the NT1/PT1 transistor pair is connected to each of the complement signals of W0, WB0, W1, and WB1 respectively corresponding to the signal at the input of the NAND.

Figure 6:
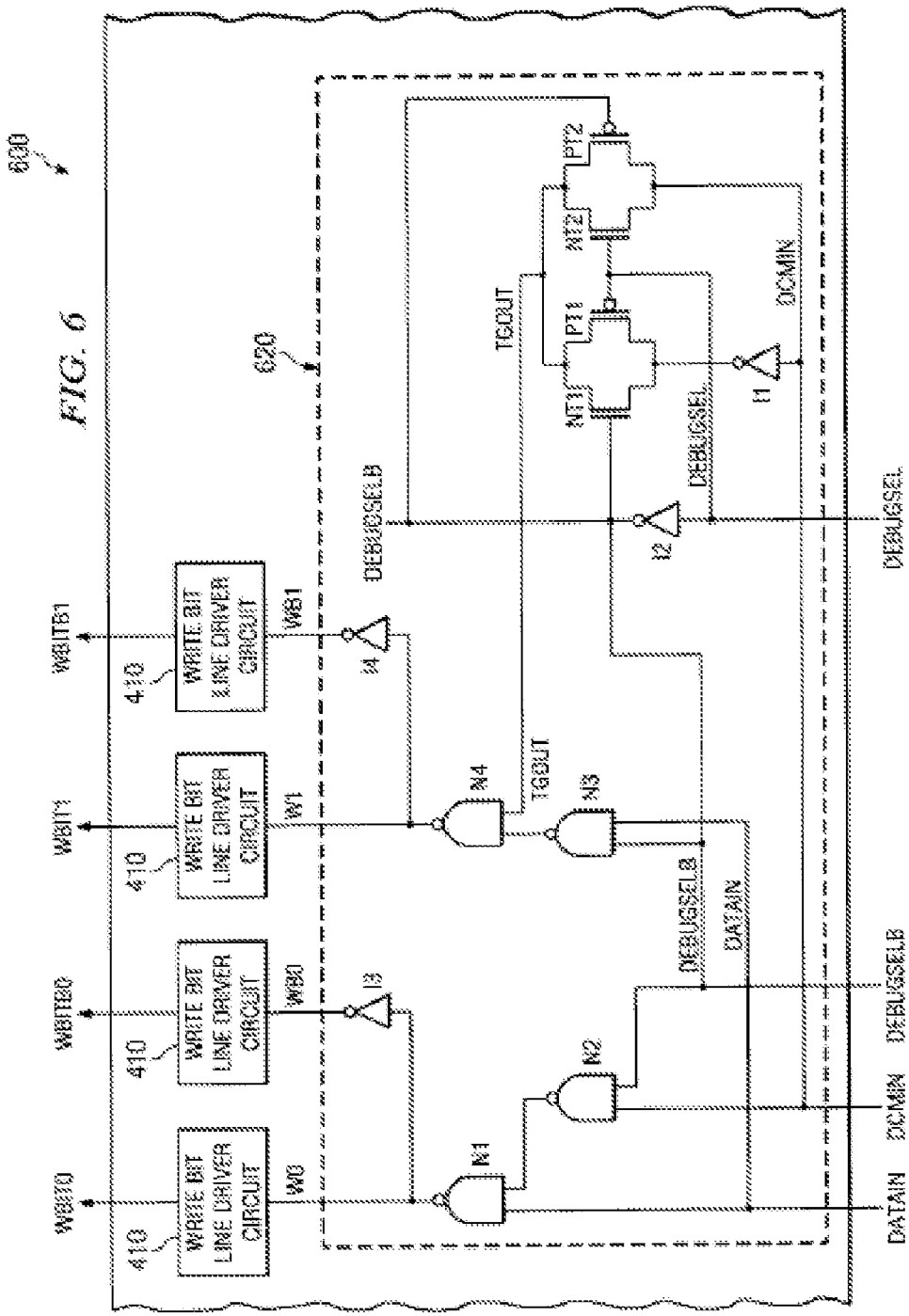
FIG. 6 is a schematic diagram of a write bit line driver and data decode bypass circuit in a TCAM cell according to an embodiment of the present invention.

Referring now to FIG. 6, there is illustrated an example write bit line driver and decoder circuit 600, which includes the data decode bypass circuit in debug mode. As shown in FIG. 6, the write bit line driver and decoder circuit 600 includes a write bit line driver circuit 410 and a data decode bypass circuit 620. The data decode bypass circuit 620 further includes a first NAND gate N1, a second NAND gate N2, a third NAND gate N3, a fourth NAND gate N4, a first inverter I1, a second inverter I2. The first NAND gate N1 includes a first input DATAIN, a second input which is connected to the output of the second NAND gate ND2. The second NAND gate N2 includes a first input DCMIN, a second input DEBUGSELB, and an output connecting to the second input of the first NAND gate N1. The output of the first NAND gate N1 is connected to signal W0. Signal W0 is the input of a third inverter I3, the output of I3 coupled to signal WB0. The complementary signals W0 and WB0 are coupled to each of an associated write bit line driver circuit. The output of each of the write bit line driver and block coming from each of the W0 and WB0 signals is WBIT0 and WBITB0 respectively.

Further referring to FIG. 6, the data decode bypass circuit 620 further includes as illustrated a third NAND gate N3, and a fourth NAND gate N4, and a fourth inverter I4. The inputs to the NAND gate N3 are DATAIN and DEBUGSELB and the output of N3 is connected to the first input of the NAND gate N4. The second input to the NAND gate N4 is connected to TGOUT (described in the next paragraphs). The output of N4 is connected to W1, whereas the inverted output of N4 is connected to WB1, the complement signal of W1. Signals W1 and WB1 are connected to each of an associated write bit line driver circuit 410. The output of each of the write bit line driver circuit 410 from each of the W1 and WB1 signals is WBIT1 and WBITB1 respectively Further, the decode bypass circuit 620 as shown in FIG. 6 includes a first transmission gate consisting of a first transistor pair NT1/PT1 and a second transmission gate consisting of a second transistor pair NT2/PT2. The gates of NT1 and NT2 are of N channel type and the gates of transistors PT1 and PT2 are of P channel type. Each transistor pair denotes a transmission gate and creates a conduction path between the two pairs of transistors. The conduction path is controlled by the complementary signals DEBUGSEL and DEBUGSELB. The gates of transistors NT1 and PT2 are connected to the DEBUGSELB input while the gates of the transistors PT1 and NT2 are connected to the DEBUGSEL input. The inputs of the transistor pair NT2/PT2 are connected to the DCMIN data input, while the inputs of the transistor pair NT1/PT2 are connected to the inverted signal of DCMIN. The outputs of the transistor pairs NT1/PT1 and NT2/PT2 are connected to the TGOUT output signal representing the output signal of the transmission gate.

The output signal TGOUT is connected to the second input of the fourth NAND gate N4. When DEBUGSEL is at logic ZERO, the output TGOUT receives signal from the output of inverter I1, which receives the inverted DCMIN input. When DEBUGSEL is at logic ONE, TGOUT passes the input value at DCMIN. As shown, the source terminals of the transistor pair NT1/PT1 is connected to the inverted input of DCMIN and the sources of each of the transistor pair NT2/PT2 are connected to the DCMIN data input, and the drains of both transistor pairs NT1/PT1 and NT2/PT2 are connected together to the TGOUT data output.

Referring now to FIGS. 7a and 7b, there is illustrated a truth table depicting the operation of the write bit line driver circuit 410 as shown in FIG. 6. In operation, the data decode circuit 620 described above receives the external input signals DATAIN and DCMIN. For example, in the normal mode as shown in FIG. 6A, if, DATAIN=0, DCMIN=0, then W0=1, WB0=0, W1=0, WB1=1, wherein WB0 is the complement of W0 and WB1 is the complement of W1. If, DATAIN=1, DCMIN=0, then W0=0, WB0=1, W1=1, WB1=0. If, DATAIN=0, DCMIN=1, then W0=1, WB0=0, W1=1, WB1=0. If, DATAIN=1, DCMIN=1, then W0=1, WB0=0, W1=1, WB1=0. Further, in the debug mode as shown in FIG. 7b, if, DATAIN=0, DCMIN=0, then W0=1, WB0=0, W1=0, WB1=1, wherein WB0 is the complement of W0 and WB1 is the complement of W1. If, DATAIN=1, DCMIN=0, then W0=0, WB0=1, W1=1, WB1=0. If, DATAIN=0, DCMIN=1, then W0=1, WB0=0, W1=1, WB1=0. If, DATAIN=1, DCMIN=1, then W0=1, WB0=0, W1=1, WB1=0. In the normal mode the DEBUGSEL input is connected to a 0 while its complement signal DEBUGSELB is connected to a 1. In the debug mode, the DEBUGSEL input is connected to a 1, while its corresponding complement signal DEBUGSELB is connected to a 0.

The above-described methods and apparatus provide a scheme to bypass data decoding in a debug mode, associated with TCAM cells in a TCAM array. Such a scheme will allow for raw data to be written as is (without decoding), making fault testing possible. It is expected that the above-described methods and apparatus can also be implemented for binary CAM cells.

While the present subject matter has been described with reference to static memory elements, it is anticipated that dynamic memory elements can also be used to store the data bits.

Although FIGS. 6, 7a, 7b are illustrative of only one embodiment, it can be envisioned that there are other embodiments. Although the invention described here applies to a conventional TCAM cell, it applies to any kind of TCAM cells, for example a stacked TCAM cell arrangement. As can be seen the above described method provides a fault testing capability for TCAMs. The above described method also provides application specific uses in routers and networking products.

The above-described methods and apparatus provide various schemes to provide testability and exhaustive fault coverage for TCAM cells. The inventive features of the built in self test circuit incorporating the decode bypass circuit can be implemented in any kind of CAM cells. While the present subject matter has been described with reference to static memory elements, it is can be used in dynamic TCAM cells also. The proposed technique increases performance and testability of TCAM arrays.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

The invention is a novel array fault testing technique for a TCAM system by providing a data decode bypass circuit. The data decode bypass circuit of the TCAM cell provides a raw write feature to detect faults in a full suite of memory related tests. The debug input of the data decode bypass circuit of the TCAM cell when asserted in the test mode enables the TCAM cell to write raw, nondecoded data into the array, and when deasserted in the test mode, enables the testing of the TCAM array. The resulting TCAM cell provides exhaustive fault testing thereby detecting and eliminating faults in TCAMS. The invention also provides cost savings in the area of testability of TCAMS since testing costs of TCAMS are high due to the unique configuration and complexity of TCAM system design.

The invention as described, allows the logic array to be better tested, whereas without the data decode bypass circuit, it cannot be completely tested, and further allows readily available BIST tools that create memory tests for screening memory defects, without remappings and restrictions for TCAMs. Using read and write controls in the TCAM along with the debug signal, the same memory test algorithms can be applied to the TCAM arrays. Whereas in conventional circuits without the data decode bypass circuit, some of the standard memory test algorithms cannot be applied while greater effort must be applied to modify the BIST tools to test the array for algorithms.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-7a, 7b are merely representational and are not drawn to scale. Certain proportions thereof may be exaggerated, while others may be minimized. FIGS. 1-6a, 6b illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A ternary content addressable memory (TCAM) system comprising:
   a write/search bit line decoder and driver circuit; and
   a TCAM block array including multiple TCAM blocks, wherein the TCAM block array is organized into at least one rectangular array having rows each having a plurality of TCAM blocks, wherein each TCAM block is associated with a row and a column of the TCAM block array, and wherein each TCAM block comprising:
      a plurality of TCAM cells, wherein the TCAM block is arranged into at least one rectangular array, wherein each TCAM cell is associated with a row and a column in the TCAM block;
      an associated read/write bit line coupled between each TCAM cell and the write/search bit line decoder and driver circuit and wherein during a write cycle the write bit line decoder and driver circuit to write a data bit to each TCAM cell via the associated read/write bit line; and
      an associated data decode bypass circuit wherein during a debug mode, the bypass circuit allows the TCAM to write raw nondecoded data, for testing purposes.

2. The system of claim 1, further comprising:
   a sense amplifier; and
   a pair of precharge circuits, wherein each TCAM cell is coupled to the sense amplifier and the pair of precharge circuits via the associated read/write bit line, wherein during a read cycle the sense amplifier to read a stored data bit in each TCAM cell via the associated read/write bit line, and wherein during a precharge cycle the pair of precharge circuits to charge each read/write bit line substantially after completing the read cycle.

3. The system of claim 2, further comprising:
   an input/output (I/O) driver; and
   as associated read/write complement bit line coupled between each TCAM cell in each TCAM block and the write/search bitline decoder and driver circuit, wherein during a read cycle the I/O driver to read a stored data bit and a stored complement data bit in each TCAM cell via the associated read/write complement bit line and during a write cycle the I/O driver to write a data bit to each TCAM cell via the associated read/write complement bit line, wherein during the precharge cycle the write/search bitline decoder and driver circuit to precharge each associated read/write complement bit line substantially after completing the write cycle, and wherein the pair of precharge circuits to precharge the read/write bit lines substantially after completing the read/write cycle.

4. The system of claim 3, further comprising:
   a search bit line and a search bit complement line that are connected between each TCAM cell and the write/search bit driver circuit, and during a precharge cycle the write/search bitline decoder and driver circuit to drive each search bit line and search bit complement line.

5. The system of claim 4, wherein each TCAM cell further comprises:
   a pair of memory elements for storing a data bit and a complement data bit; and
   a pair of comparison circuits coupled to the pair of memory elements that compares the stored data bit and the stored data bit complement with a received compare data bit via the search bit line and the search complement bit line, respectively, and drives a match/mismatch signal onto an associated MATCH line when the stored data bit and the stored complement data bit are not equal to the compare data bit.

6. The system of claim 5, wherein the pair of memory elements is a pair of SRAM cells.

7. The system of claim 5, wherein the write bit line driver and decoder circuit comprises:
   a data decode circuit for receiving input signals from the I/O driver during normal mode;
   a data decode bypass circuit to bypass decoding the input signals from the I/O driver during debug mode;
   a write bit line driver circuit associated with each read/write bit line and each complement read/write line of a TCAM cell coupled between the data decode circuit and the associated read/write bit line and the complement read/write line.

8. The system of claim 7, wherein the data decode bypass circuit in each write bit line driver circuit comprises:
   a first NAND gate having a first input, second input and an output, wherein the first input of the first NAND gate is coupled to receive a DATAIN signal, and wherein the second input is coupled to receive a signal from the second NAND gate, and an output W0, wherein W0 is coupled to a write bit line driver circuit to receive an output WBIT0; and wherein W0 is inverted and coupled to another write bit line driver circuit to receive a WBITB0 output;
   a second NAND gate having a first input, second input, and an output, wherein the first input of the second NAND gate is coupled to an input DCMIN signal, and wherein the second input of the second NAND gate is coupled to the DEBUGSELB input and, wherein the output of the second NAND gate is coupled to the second input of the first NAND gate;
   a third NAND gate having a first input, second input and an output, wherein the first input of the third NAND gate is coupled to the DEBUGSELB signal, and wherein the second input of the third NAND gate is coupled to the DATAIN signal, and an output;
   a fourth NAND gate having a first input, second input and an output, wherein the first input of the fourth NAND gate coupled to receive the output of the third NAND gate, the second input of the fourth NAND gate is coupled to receive a TGOUT signal, wherein the output of the fourth NAND gate is coupled to the signal W1, wherein W1 is coupled to a write bit line driver circuit to receive an output WBIT1, wherein the inverted signal WB1 of W1 is coupled to another write bit line driver circuit to receive an output is WBITB1, and wherein;

a transmission gate circuit consisting of a first transistor pair NT1/PT1 and a second transistor pair NT2/PT2 for controlling the conduction path of the DCMIN input signal, and wherein the first transistor pair NT1/PT1 and second transistor pair NT2/PT2 are coupled to provide an output signal TGOUT, wherein the signal TGOUT is coupled to the second input of the fourth NAND gate.

9. A ternary content addressable memory (TCAM) circuit comprising:

a write/search bit line decoder and driver circuit; and a TCAM block array including (M×N) TCAM blocks arranged in M number of rows and N number of columns, wherein each CAM block comprising:

(m×n) TCAM cells arranged in a rectangular array of m number of rows and n number columns;

an associated read/write bit line coupled between each TCAM cell in each TCAM block and the write/search bitline decoder and driver circuit, and wherein during a write cycle the write/search bitline decoder and driver circuit to write a data bit to each TCAM cell via the associated read/write bit line; and an associated data decode bypass circuit wherein during a debug mode, the bypass circuit allows the TCAM to operate as a normal RAM for testing purposes.

10. The circuit of claim 9, further comprising:

a sense amplifier; and a pair of precharge circuits, wherein each TCAM cell is coupled to the sense amplifier and the pair of precharge circuits via the associated read/write bit line, wherein during a read cycle the sense amplifier to read a stored data bit in each TCAM cell via the associated read/write bit line, and wherein during a precharge cycle the pair of precharge circuits to charge each read/write bit line substantially after completing the read cycle.

11. The circuit of claim 10, further comprising:

an input/output (I/O) driver; and an associated read/write complement bit line coupled between each TCAM cell in each CAM block and the write/search bitline decoder and driver circuit, wherein during a read cycle the I/O driver to read a stored data bit and a stored complement data bit in each TCAM cell via the associated read/write complement bit line and during a write cycle the I/O driver to write a data bit to each TCAM cell via the associated read/write complement bit line, and wherein during the precharge cycle the write bit line driver circuit to precharge each associated read/write complement bit line substantially after completing the search cycle and the write cycle.

12. The system of claim 11, wherein the write bit line driver and decoder circuit comprises:

a data decode circuit for receiving input signals from the I/O driver during normal mode;

a data decode bypass circuit to bypass the decoding of the input signals from the I/O driver during debug mode;

a write bit line driver circuit associated with each read/write bit line and each complement read/write line of a TCAM cell coupled between the data decode circuit and the associated read/write bit line and the complement read/write line.

13. The system of claim 12, wherein the data decode bypass circuit in each write bit line driver circuit comprises:

a first NAND gate having a first input, second input and an output, wherein the first input of the first NAND gate is coupled to receive a DATAIN signal, and wherein the second input is coupled to receive a signal from the second NAND gate, and an output W0, wherein W0 is coupled to a write bit line driver circuit to receive an output WBIT0; and wherein W0 is inverted and coupled to another write bit line driver circuit to receive a WBITB0 output;

a second NAND gate having a first input, second input, and an output, wherein the first input of the second NAND gate is coupled to an input DCMIN signal, and wherein the second input of the second NAND gate is coupled to the DEBUGSELB input and, wherein the output of the second NAND gate is coupled to the second input of the first NAND gate;

a third NAND gate having a first input, second input and an output, wherein the first input of the third NAND gate is coupled to the DEBUGSELB signal, and wherein the second input of the third NAND gate is coupled to the DATAIN signal, and an output;

a fourth NAND gate having a first input, second input and an output, wherein the first input of the fourth NAND gate coupled to receive the output of the third NAND gate, the second input of the fourth NAND gate is coupled to receive a TGOUT signal, wherein the output of the fourth NAND gate is coupled to the signal W1, wherein W1 is coupled to a write bit line driver circuit to receive an output WBIT1, wherein the inverted signal WB1 of W1 is coupled to another write bit line driver circuit to receive an output is WBITB1, and wherein, a transmission gate circuit consisting of a first transistor pair NT1/PT1 and a second transistor pair NT2/PT2 for controlling the conduction path of the DCMIN input signal, and wherein the first transistor pair NT1/PT1 and second transistor pair NT2/PT2 are coupled to provide an output signal TGOUT, wherein the signal TGOUT is coupled to the second input of the fourth NAND gate.

14. The system of claim 12 wherein the write bit line decoder and driver circuit comprises:

a data decode circuit for receiving input signals from an I/O driver via a control circuit; and a data decode bypass circuit to bypass decoding the input signals from the I/O driver during debug mode.

15. A method of bypassing the decoding in a TCAM block array, wherein the TCAM block array including a plurality of TCAM blocks, wherein the TCAM block array is organized into at least one rectangular array having rows each having a plurality of CAM blocks, wherein each CAM block including a group of CAM cells, wherein each CAM cell coupled to a read/write bit line and a search bit line comprising:

reading a TCAM cell using an associated read/write bit line;

precharging each read/write bit line substantially after completing a read cycle using one or more precharge circuits;

writing to the TCAM cell using an associated read/write bit line;

precharging each read/write bit line substantially after completing a write cycle using a precharge circuit;
precharging each search bit line in the TCAM block array using the precharge circuit substantially after completing a search operation;
determining if the TCAM cell is used in a normal mode or a debug mode; and writing the nondecoded data into the TCAM cell when used in a debug mode; and writing the nondecoded data into the TCAM cell when used in a normal mode.

16. The method of claim 15, wherein, the data decode bypass circuit provides, a debug mode during which nondecoded data is written, thereby providing a means for fault detection for testing purposes.

17. The method of claim 15 wherein the data decode bypass circuit provides testing of BIST tools for fault detection and screening.

\* \* \* \* \*